United States Patent [19]

Nakatoh et al.

[11] Patent Number: 4,972,159
[45] Date of Patent: Nov. 20, 1990

[54] AMPLIFIER CIRCUIT MORE IMMUNE TO FLUCTUATION OF REFERENCE VOLTAGE

[75] Inventors: Yoshihisa Nakatoh; Kazuharu Date; Tooru Yamamoto; Shigeki Imai, all of Nara, Japan

[73] Assignee: Sharp Kabushiki Kaisha, Osaka, Japan

[21] Appl. No.: 398,925

[22] Filed: Aug. 28, 1989

[30] Foreign Application Priority Data

Aug. 29, 1988 [JP] Japan .................. 63-214663

[51] Int. Cl.$^5$ .......................... H03F 3/45; H03F 1/26
[52] U.S. Cl. ................................. 330/261; 330/149; 330/253; 330/298
[58] Field of Search ............ 330/69, 149, 261, 207 P, 330/298, 253

[56] References Cited

U.S. PATENT DOCUMENTS

| | | | |
|---|---|---|---|
| 3,918,004 | 11/1975 | Shimizu et al. | 330/261 |
| 4,005,371 | 1/1977 | Hongu et al. | 330/261 |
| 4,290,026 | 9/1981 | Shoji | 330/261 X |
| 4,539,529 | 9/1985 | Lenz | 330/261 X |

FOREIGN PATENT DOCUMENTS

| | | | |
|---|---|---|---|
| 66356 | 6/1977 | Japan | 330/261 |
| 78612 | 6/1980 | Japan | 330/261 |
| 158706 | 8/1985 | Japan | 330/261 |
| 16705 | 1/1988 | Japan | 333/261 |

Primary Examiner—James B. Mullins

[57] ABSTRACT

An amplifier circuit having a differential amplifier, provided in a semiconductor integrated circuit is disclosed. The differential amplifier has one input connected to a reference voltage generating circuit. The voltage outputted from the reference voltage generating circuit includes a voltage fluctuation depending on the fluctuation in power-supply voltage Vcc. However, a fluctuation absorbing circuit comprising resistors 51 and 52, diodes 53 and 54, and a capacitor 55 absorbs the voltage fluctuation thereof. As a result, the change in offset voltage of the differential amplifier is prevented, resulting in an improvement of a power-supply rejection ratio.

9 Claims, 3 Drawing Sheets

AMPLIFIER CIRCUIT MORE IMMUNE TO FLUCTUATION OF REFERENCE VOLTAGE

BACKGROUND OF THE INVENTION

1. Field of the Invention

This invention relates generally to amplifier circuits and, more particularly, to an amplifier circuit operating based on a reference voltage, the voltage level of which tends to fluctuate. This invention has a particular applicability to an amplifier circuit provided in a semiconductor integrated circuit.

2. Description of the Background Art

For example, a differential amplifier for amplifying an input signal is often provided in a conventional semiconductor integrated circuit. The differential amplifier has one input connected to receive the input signal and another input connected to receive a prescribed reference voltage.

FIG. 1 is a circuit diagram illustrating an input portion of a conventional semiconductor integrated circuit 2. This integrated circuit 2 comprises a differential amplifier 1 for amplifying an input signal, and a reference voltage generating circuit 3 for applying a prescribed reference direct current voltage (hereinafter referred to as a reference DC voltage) to the differential amplifier 1. The differential amplifier 1 comprises a constant current source 11, PMOS transistors 12 and 14, and NMOS transistors 13 and 15. The transistor 14 has its gate connected to receive the input signal via a pad 82. The transistor 12 has its gate connected to the reference voltage generating circuit 3. An output signal of the differential amplifier 1 is applied to a circuit connected to the succeeding stage, e.g. a comparator. The reference voltage generating circuit 3 comprises resistors 31 and 32 connected in series between a power supply Vcc (=5 V) and the ground (=0 V). This circuit 3 applies an output voltage of 2.5 V as a reference voltage to the amplifier 1. Further, the transistor 12 in the amplifier 1 is connected to receive a signal externally applied via the pad 81. The transistor 12 has its gate connected to a protection circuit formed of diodes 41 and 42 and a resistor 43. The protection circuit protects the transistor 12 from being destroyed by an input signal having its voltage level exceeding a prescribed value, or a surge voltage.

In operation, the reference voltage generating circuit 3 applies the reference voltage of 2.5 V to the differential amplifier 1. The differential amplifier 1 outputs a signal Va amplified responsive to the reference voltage and an input signal Vin externally applied. The output signal Va includes a voltage signal having a reference level of 2.5 V.

However, it could occur that an output voltage from the reference voltage generating circuit 3 frequently fluctuates depending upon the fluctuation of the power supply Vcc. In such a case, the output signal Va of the differential amplifier 1 is affected by the fluctuation of the output voltage of the circuit 3.

A power-supply rejection ratio (hereinafter referred to as PSRR) is, in general, defined as a ratio of a change in an input offset voltage to a corresponding change in one power-supply, with all remaining power voltages held constant. That is, the PSRR shows a change in an offset voltage of the amplifier caused by the fluctuation in the power-supply voltage. As described above, since the reference voltage generating circuit 3 shown in FIG. 1 applies the voltage affected by the fluctuation in the power supply Vcc to the differential amplifier 1, the differential amplifier 1 attains a higher PSRR. That is, it is not preferable because the offset voltage of the differential amplifier 1 fluctuates as per the fluctuation in the power supply Vcc.

SUMMARY OF THE INVENTION

It is an object of this invention to improve a power-supply rejection ratio of an amplifier circuit.

It is another object of this invention to decrease the change in offset voltage of the amplifier circuit, caused by fluctuation in a power-supply voltage.

It is a further object of this invention to absorb the fluctuation in a reference voltage applied to a differential amplifier circuit.

It is a still further object of this invention to improve the power-supply rejection ratio of the amplifier circuit provided in a semiconductor integrated circuit.

Briefly, the amplifier circuit according to this invention comprises a differential amplifier for differentially amplifying a voltage signal applied between first and second inputs, a reference voltage generating circuit for applying a reference DC voltage to the second input of the differential amplifier, and a fluctuation decreasing circuit for decreasing voltage fluctuation included in the voltage generated by the reference voltage generating circuit. The differential amplifier has the first input connected to receive an input signal.

In operation, the reference voltage generating circuit applies a reference voltage including the voltage fluctuation to the second input of the differential amplifier. Fluctuation decreasing means decreases the voltage fluctuation included in the reference voltage. Therefore, an output signal of the differential amplifier is less affected by the fluctuation in the reference voltage.

The amplifier circuit according to this invention is applied to a semiconductor integrated circuit in a preferred embodiment.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
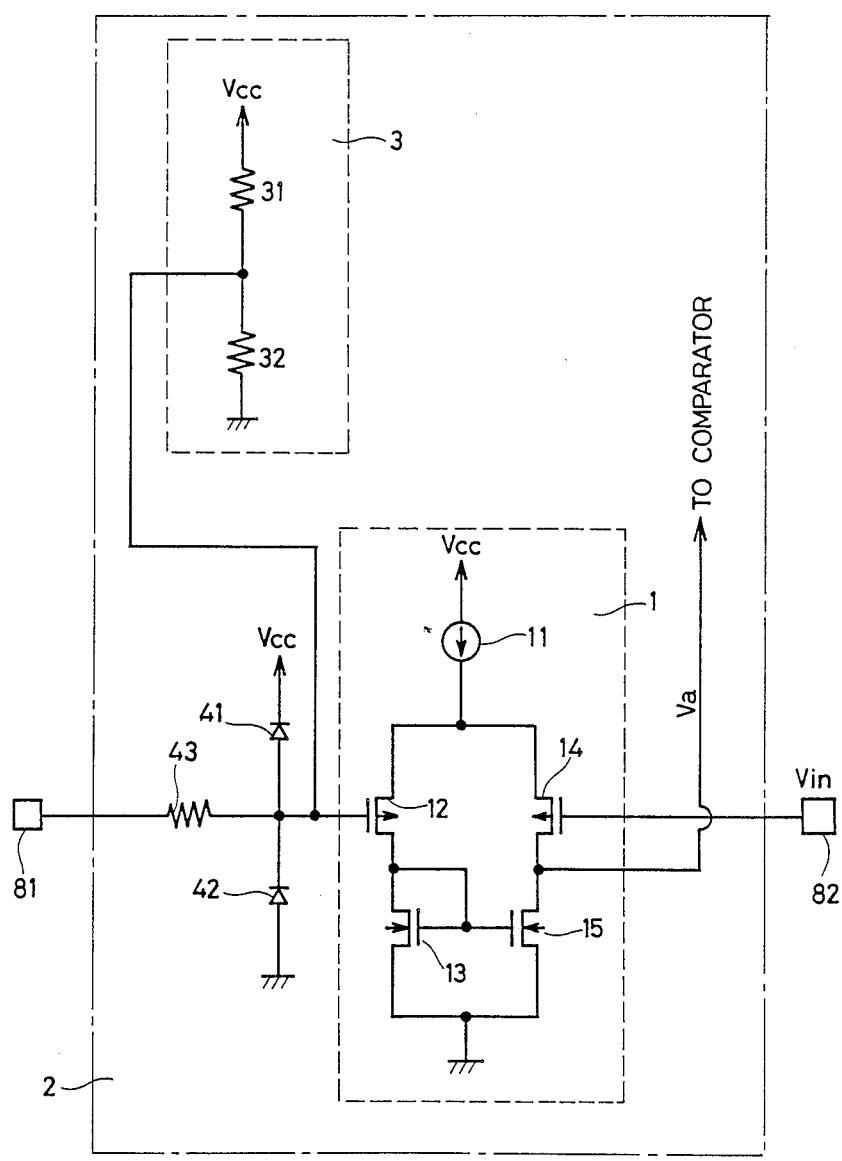
FIG. 1 is a circuit diagram illustrating a conventional amplifier circuit provided in a semiconductor integrated circuit.
Figure 2:
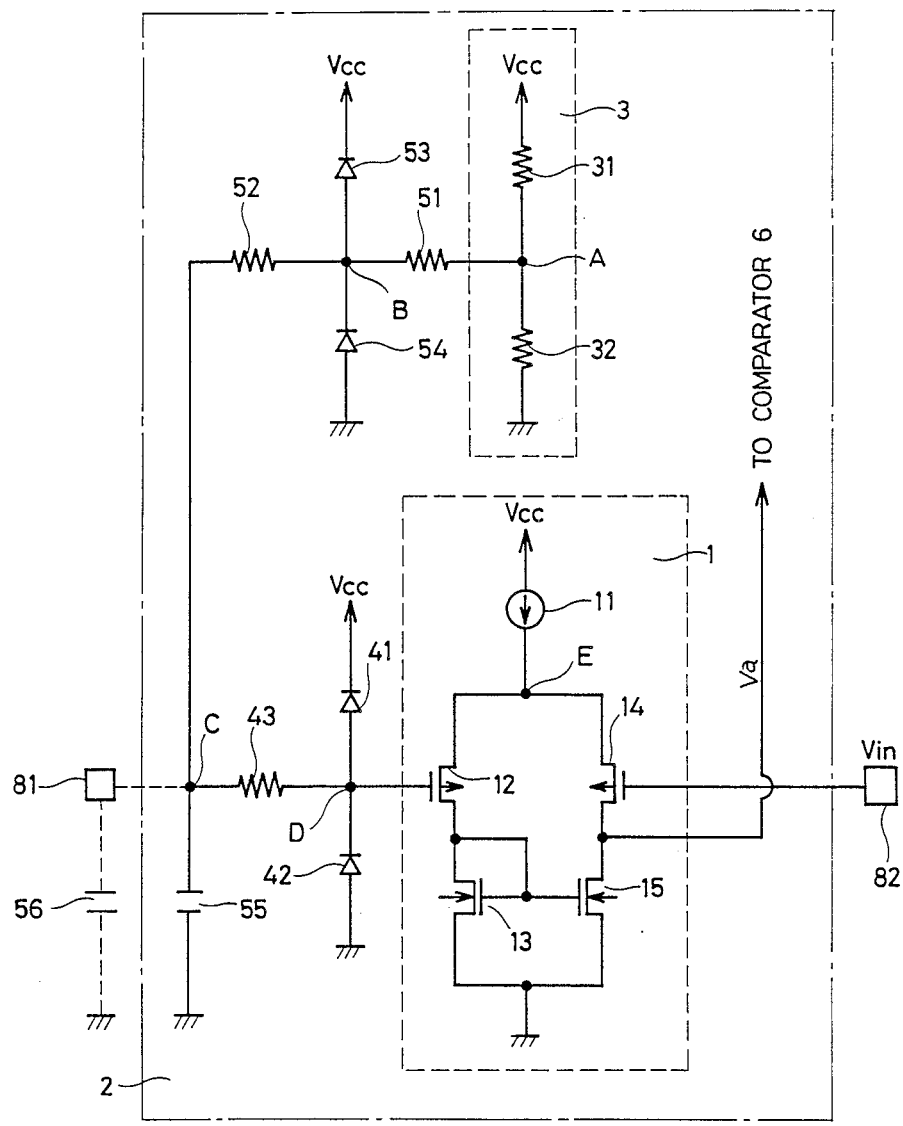
FIG. 2 is a circuit diagram of an amplifier circuit illustrating one embodiment of the invention.

FIG. 2 is a circuit diagram of an amplifier circuit illustrating one embodiment of the invention. In comparison with the circuit shown in FIG. 1, the amplifier circuit shown in FIG. 2 further comprises a fluctuation decreasing circuit for decreasing the fluctuation in a reference voltage outputted from a reference voltage generating circuit 3. This fluctuation decreasing circuit comprises resistors 51 and 52, diodes 53 and 54, and a capacitor 55 or 56. The capacitor 55 is connected between the ground and a node C connected to a reference voltage input node D of a differential amplifier 1 via a protection circuit. This capacitor 55 conducts ripple included in the reference voltage outputted from the reference voltage generating circuit 3 to the ground. The resistors 51 and 52 are connected in series between an output node A of the reference voltage generating circuit 3 and a node C. Therefore, the fluctuation voltage included in the reference voltage can be sufficiently decreased by the resistors 51 and 52 and the capacitor 55. Furthermore, the diode 53 is connected between a common connection node B of the resistances 51 and 52 and a power supply Vcc, and the diode 54 is connected between the node B and the ground. Each of the diodes 53 and 54 is connected in a reverse bias direction in the normal state. The diode 53 is rendered conductive when a voltage exceeding the power supply Vcc level is applied to the node B. The diode 54 is rendered conductive when a voltage lower than the ground level is applied to the node B. Therefore, the voltage of the node B, i.e., the output voltage of the reference voltage generating circuit 3 can be limited to a value between a power supply Vcc potential and a ground potential.

That is, when a large voltage fluctuation exceeding the power supply Vcc level or the ground level occurs, the effective operation of the diodes 53 and 54 limits the fluctuation within a prescribed range. On the other hand, a smaller voltage fluctuation is decreased by the resistors 51 and 52 and the capacitor 55. As a result, the change in offset voltage of the differential amplifier 1 is prevented. Therefore, the PSRR is more improved compared to that in the circuit shown in FIG. 1. The capacitor 55 is provided in the integrated circuit 2; however, the same effect is achieved by replacing the capacitor 55 with a capacitor 56 provided outside of the integrated circuit 2, as shown by the dotted line in FIG. 2.

Figure 3:
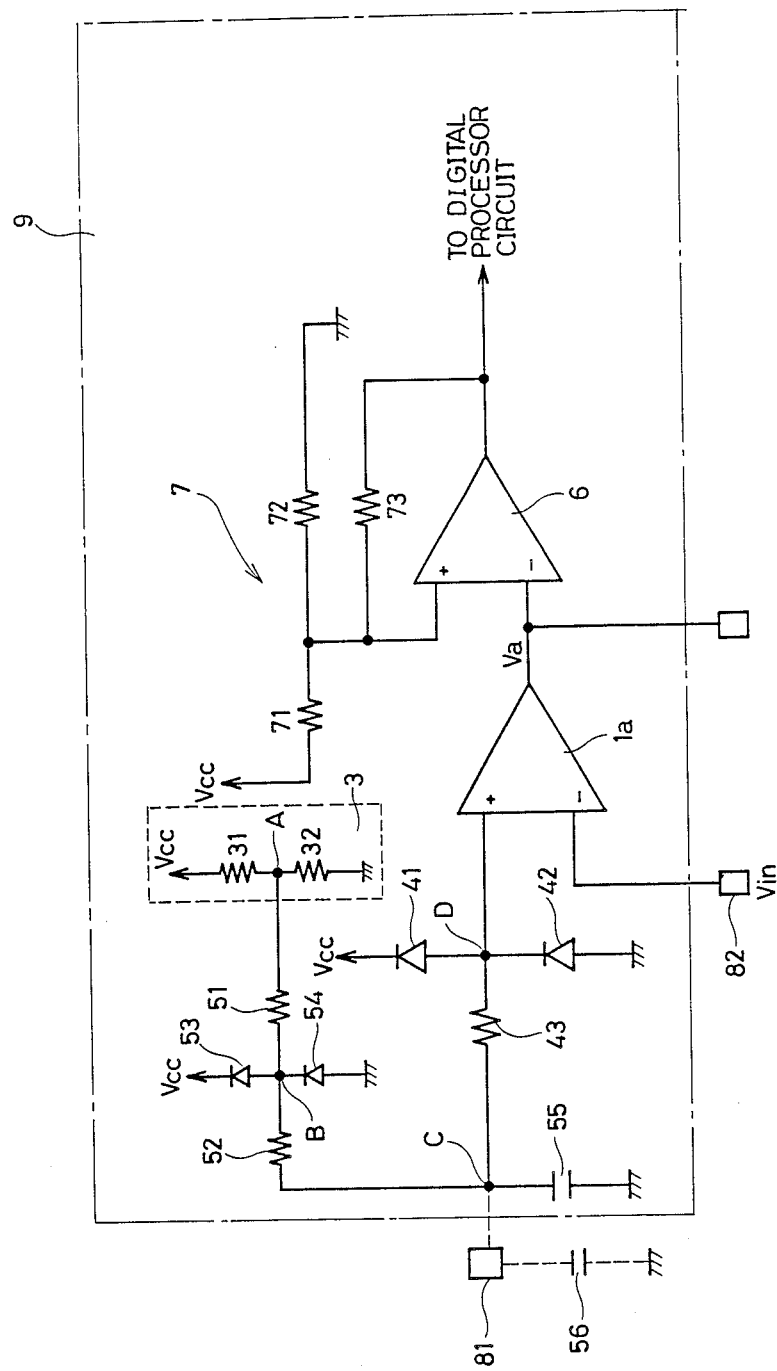
FIG. 3 is a circuit diagram illustrating an example of the amplifier circuit shown in FIG. 2, applied to the semiconductor integrated circuit.

FIG. 3 is a circuit diagram illustrating an example of the amplifier circuit shown in FIG. 2, applied to a semiconductor integrated circuit. Referring to FIG. 3, this integrated circuit 9 comprises an operational amplifier 1a as the differential amplifier, a circuit 7 having hysteresis characteristics and formed of resistors 71, 72 and 73, and a comparator 6 for comparing an output signal from the operational amplifier 1a with an output signal from the circuit 7. The same circuit as the one shown in FIG. 2 is connected to the preceding stage of the operational amplifier 1a. The output of the comparator 6 is connected to a digital processor circuit provided in this integrated circuit 9.

In operation, the operational amplifier 1a applies an amplified output signal Va to an inversion input of the comparator 6 in response to an input signal Vin. Since a non-inversion input of the comparator 6 is connected to the circuit 7 having hysteresis characteristics, the output of the comparator is prevented from being inverted when the signal Va is at an intermediate level. That is, the output signal of the comparator 6 is more immune to noises included in the signal Va.

As has been described, since the circuit for decreasing the fluctuation in the reference voltage generated by the circuit 3 is connected between one input of the differential amplifier 1 and the differential voltage generating circuit 3, as shown in FIG. 2, the voltage fluctuation thereof is absorbed. Therefore, the change in offset voltage of the differential amplifier 1 is prevented, resulting in an improvement of the PSRR. The amplifier circuit according to this invention is, for example, applicable when an operational amplifier having a high gain is employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An amplifier circuit provided in a semiconductor integrated circuit, for amplifying an input signal applied to an input terminal, comprising:
    differential amplifier means having first and second inputs for differentially amplifying a voltage signal applied between said first and second inputs;
    said differential amplifier means having the first input connected to receive an input signal via said input terminal;
    reference voltage generating means connected to the second input of said differential amplifier means for generating a reference direct current voltage;
    the reference voltage generated by said reference voltage generating means having a tendency to fluctuate; and
    fluctuation decreasing means connected between said reference voltage generating means and the second input of said differential amplifier means for decreasing a voltage fluctuation included in the voltage generated by said reference voltage generating means, said fluctuation decreasing means including ripple absorbing means for absorbing ripple included in the voltage generated by said reference voltage generating means, voltage limiting means for limiting the voltage generated by said reference generating means for limiting the voltage generated by said reference voltage generating means within a prescribed range, voltage decreasing means for decreasing the voltage generated by said reference voltage generating means, each of said ripple absorbing means, means for limiting and voltage decreasing means operatively connected to the output of said reference voltage generating means.

2. An amplifier circuit in accordance with claim 1, wherein said differential amplifier means comprises an operational amplifier.

3. The amplifier circuit of claim 1 wherein said ripple absorbing means comprises capacitor means coupled between the output of said reference voltage generating means and ground;
    said voltage limiting means comprises diode means connected between the output of said reference voltage generating means and a predetermined potential; said diode means is rendered reverse bias in the normal state; and
    said voltage decreasing means comprises resistor means connected between the output of said reference voltage generating means and the second output of said differential amplifier means.

4. An amplifier circuit in accordance with claim 3, wherein said predetermined potential comprises a power-supply potential.

5. An amplifier circuit in accordance with claim 3, wherein said predetermined potential comprises a ground potential.

6. The amplifier circuit of claim 3 wherein said differential circuit includes a plurality of MOS transistors.

7. The amplifier circuit of claim 3 further including an input protection circuit operatively connected between the differential amplifying means and the fluctuation decreasing means.

8. The amplifier circuit of claim 1 wherein said differential amplifier includes a plurality of MOS transistors.

9. The amplifier circuit of claim 1 further including an input protection circuit operatively connected between the differential amplifying means and the fluctuation decreasing means.

* * * * *